United States Patent
Sim et al.

(10) Patent No.: US 6,667,887 B2
(45) Date of Patent: Dec. 23, 2003

(54) METHOD AND APPARATUS FOR LOCATING AND SECURING A COMPONENT IN A COMPUTER SYSTEM

(75) Inventors: Vibora Sim, Pflugerville, TX (US); Ty R. Schmitt, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 124 days.

(21) Appl. No.: 09/957,786

(22) Filed: Sep. 21, 2001

(65) Prior Publication Data

US 2003/0058622 A1 Mar. 27, 2003

(51) Int. Cl.[7] .................................................. G06F 1/16
(52) U.S. Cl. ........................ 361/725; 361/683; 361/685; 312/223.1; 312/223.2; 248/551
(58) Field of Search ................................ 361/683–685, 361/724–727, 752, 753, 785; 312/223.1, 223.2, 257.1, 319.1, 216, 218; 248/551–553, 634–636; 29/830, 759, 760; 439/59, 155, 157; 292/42, 148, 157, 307 R

(56) References Cited

U.S. PATENT DOCUMENTS

| | | | | |
|---|---|---|---|---|
| 4,787,011 A | * | 11/1988 | Stanfield et al. | ............ 361/725 |
| 5,822,184 A | * | 10/1998 | Rabinovitz | ................... 361/685 |
| 6,062,663 A | * | 5/2000 | You et al. | ................. 312/223.2 |
| 6,122,173 A | * | 9/2000 | Felcman et al. | ............. 361/726 |
| 6,208,520 B1 | * | 3/2001 | Schmitt | ....................... 361/725 |
| 6,238,026 B1 | * | 5/2001 | Adams et al. | ........... 312/223.2 |
| 6,288,902 B1 | * | 9/2001 | Kim et al. | ................... 361/725 |
| 6,392,892 B1 | * | 5/2002 | Sobolewski et al. | ......... 361/724 |
| 6,421,911 B1 | * | 7/2002 | Misner et al. | ................. 29/842 |
| 6,466,433 B1 | * | 10/2002 | Diaz et al. | ................... 361/683 |

* cited by examiner

*Primary Examiner*—Darren Schuberg
*Assistant Examiner*—Michael Datskovsky
(74) *Attorney, Agent, or Firm*—Haynes and Boone, LLP

(57) ABSTRACT

An apparatus for securing a component in a computer system includes a housing having a component bay including a first and a second positioning device in a first sequence. A component for the bay includes a first and a second positioning device in a second sequence, which is inverse to the first sequence. In this manner, when the component is inserted into the bay, the second positioning device of the bay engages the first positioning device of the component and, simultaneously, the first positioning device of the bay engages the second positioning device of the component.

25 Claims, 4 Drawing Sheets

METHOD AND APPARATUS FOR LOCATING AND SECURING A COMPONENT IN A COMPUTER SYSTEM

BACKGROUND

The disclosures herein relate generally to computer systems and more particularly to locating and securing computer components to the computer chassis.

The connector of a computer component/device often requires precise alignment to the mating connector in the computer chassis. Inaccuracy in the connectors alignment can result in the mating connectors not plugging into each other or extra stress on the connectors due to misalignment. Additionally, some type of feature or mechanism must be provided to secure/retain the device to the computer chassis, yet still allow space for the insertion and retraction of the device.

Traditionally, the mechanical alignment and securing between a device and the chassis has been provided by the use of the perimeter walls of the device bay in the horizontal and vertical directions normal to the insertion direction. This solution is inadequate due to tolerance stack up in the bay and within the device itself. Other solutions have incorporated studs and slots added to the component device and chassis. This method worked well to align and secure the component device in the horizontal direction but not in the vertical direction. Additionally, this solution adds cost to the system.

Therefore, what is needed is a studless mechanism for securing and retaining computer devices in both horizontal and vertical directions normal to the direction of insertion in a computer chassis.

SUMMARY

One embodiment, accordingly, provides an apparatus for fixedly securing a removable component in a computer system. To this end, a housing has a component bay formed therein and the bay includes a first and a second positioning device in a first sequence. A component is provided for being removably mounted in the bay. The component includes a first and a second positioning device in a second sequence, which is inverse to the first sequence. As a result, the second positioning device of the bay engages the first positioning device of the component. Simultaneously, the first positioning device of the bay engages the second positioning device of the component.

An advantage is achieved in that the embodiment provides for precise alignment between a device and the bay in which it is inserted, thus minimizing connector misalignment and stress. This and further advantages are set forth below.

DETAILED DESCRIPTION

Figure 1:
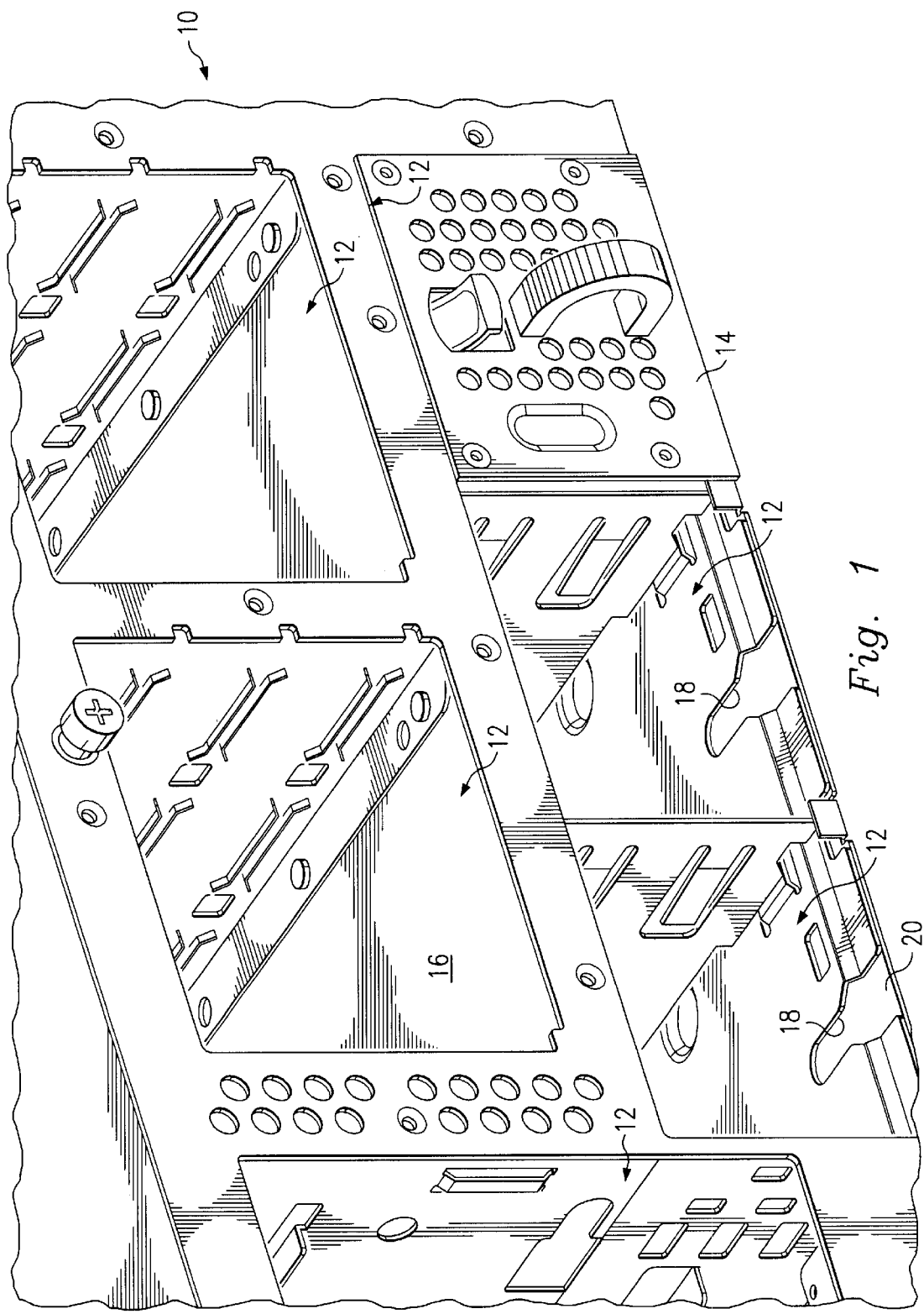
FIG. 1 is a perspective view illustrating an embodiment of a computer system housing.

A computer system chassis, such as a server chassis 10, FIG. 1, comprises a housing having a plurality of component bays 12 formed therein, each bay including at least four walls. A component such as a power supply 14 is removably mounted in one of the bays 12. A surface 16 of bay 12, see also FIG. 2, includes a first positioning device in the form of a slot 18 formed therein at a first end 20 of bay 12. A second positioning device 22 is provided at a second end 24 of bay 12, opposite the first end 20.

Figure 3:
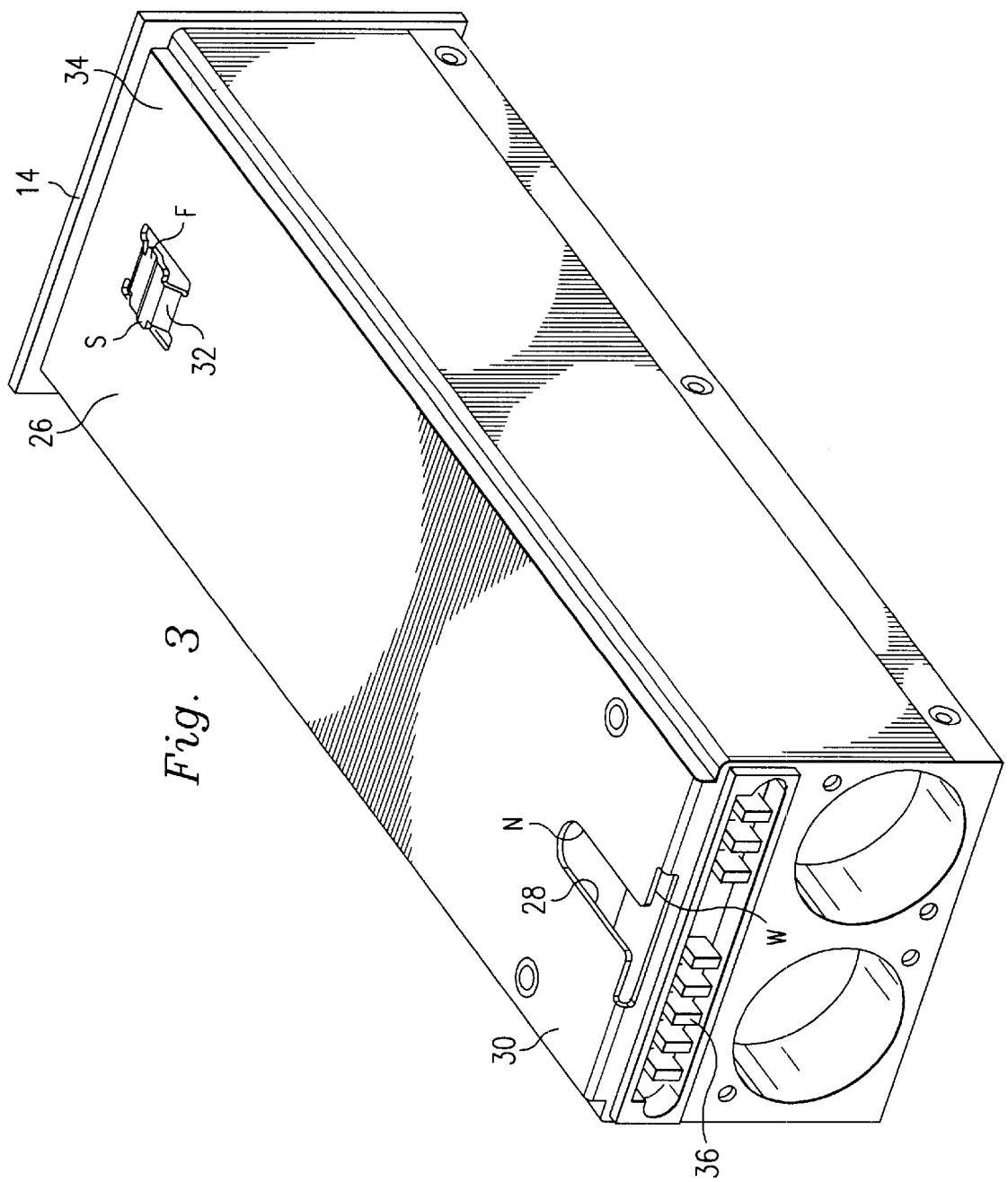
FIG. 3 is a perspective view illustrating an embodiment of a computer component.

The component 14, FIG. 3, includes a surface 26 which slidably and matingly engages surface 16 when component 14 is inserted into and removed from bay 12. Surface 26 includes a first positioning device in the form of a slot 28 at a first end 30 of component 14. A second positioning device 32 is provided at a second end 34 of component 14, opposite the first end 30. A plug member 36 is located adjacent first end 30 of component 14 for mating electrical and mechanical connection with a mating plug member (not shown) adjacent end 24 of bay 12.

Figure 2:
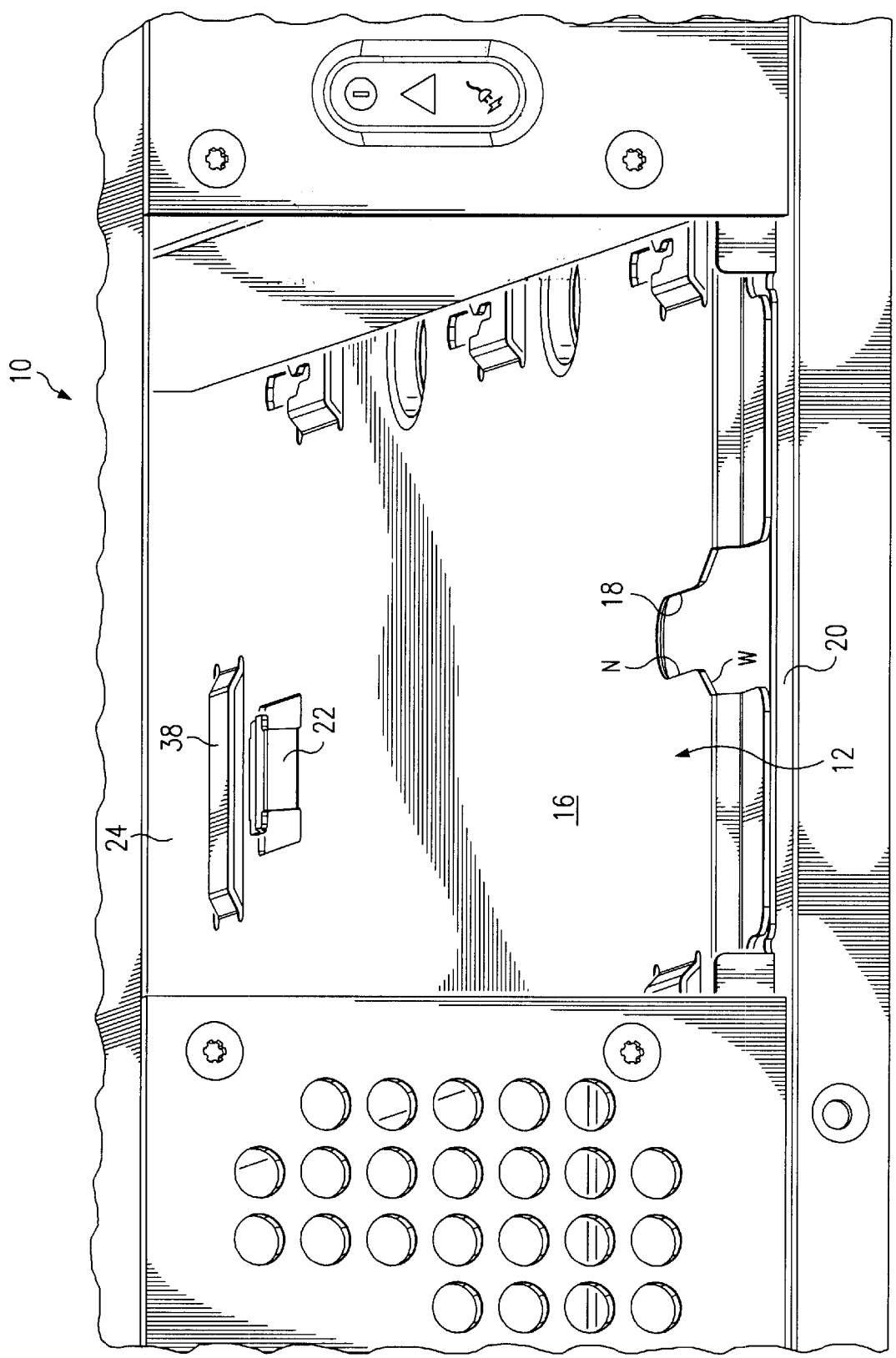
FIG. 2 is a perspective view illustrating an embodiment of a computer component bay.

The first and second positioning devices 18 and 22, respectively, of the bay 12, FIG. 2, are substantially the same as the first and second positioning devices 28 and 32, respectively, of the component 14, see also FIG. 3. That is, first positioning device 18 of bay 12 and first positioning device 28 of component 14 are substantially equivalent slots. The second positioning device 22 of bay 12 and the second positioning device 32 of component 14 are substantially equivalent tab members. However, it should be recognized that the positioning devices 18 and 22 of bay 12 are spaced apart in a first sequence and the positioning devices 28 and 32 of the component 14 are spaced apart in a second sequence which is inverse to the first sequence. In this manner, when component 14 is inserted into bay 12, slot 28 of component 14 is positioned to engage tab 22 of bay 12 and simultaneously, because of substantially equivalent alignment and spacing, tab 32 of component 14 is positioned to engage slot 18 of bay 12.

Figure 4:
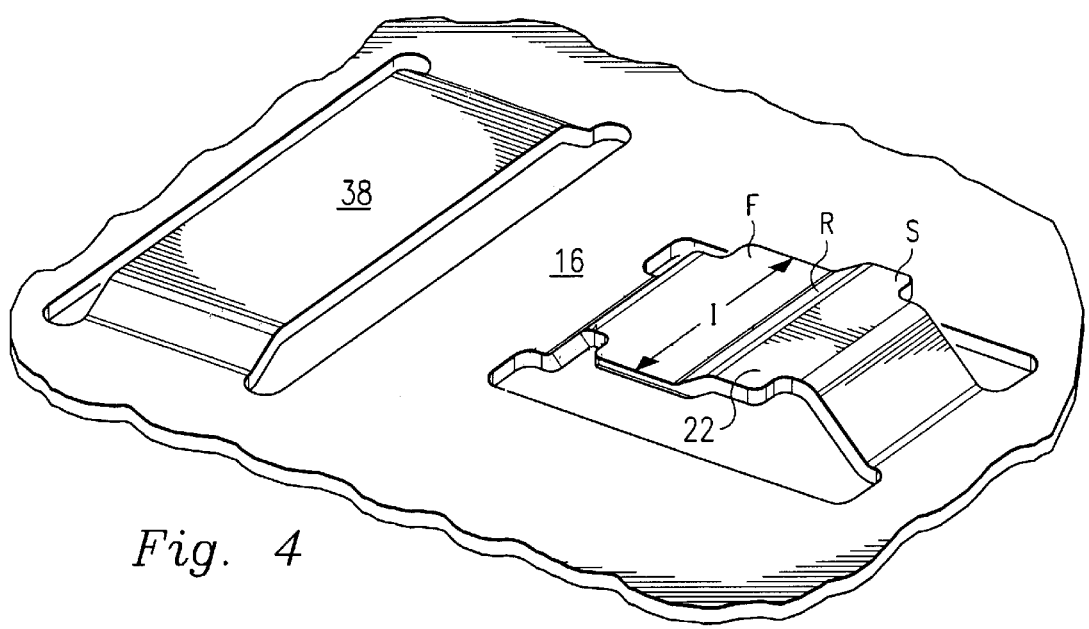
FIG. 4 is a perspective view illustrating a portion of a surface including a tab and a stop.

A raised stop 38 is provided in bay 12, see FIGS. 2 and 4. Stop 38 is positioned adjacent second positioning device 22 adjacent the second end 24 of bay 12. In this manner, stop 38 can be positioned to engage first end 30 of component 14 and limit further advance of component 14 into bay 12 when plug member 36 is properly seated.

Figure 5:
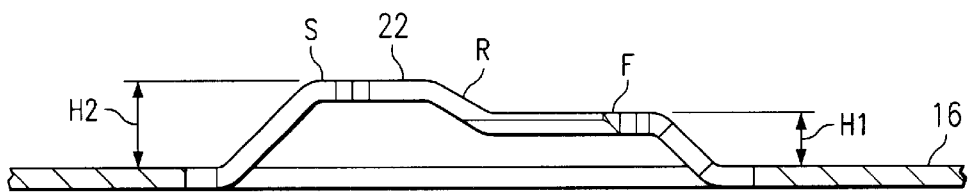
FIG. 5 is a side elevational view illustrating an embodiment of a tab.

The slots 18, 28 are engageable with tabs 32, 22, respectively, see FIGS. 1–5. Engagement of the slots 18, 28 and tabs 32, 22 is accomplished by tabs 32, 22 being inserted into and received by slots 18, 28. This is enabled due to the slots 18, 28 each including a wide portion W and a narrow portion N. The tabs 32, 22 each include a first raised portion F and a second raised portion S. A ramp R interconnects first raised portion F with second raised portion S. The first raised portion F, FIG. 5, is of a first height H1 and the second raised portion S is of a second height H2, greater than first height H1. In the case of bay 12, the portions F and S are raised relative to surface 16. In the case of component 14, the portions F and S are raised relative to surface 26. Furthermore, because the surfaces 16 and 26 are slidably engaged, the tabs 32, 22 extend in opposite directions, or toward each other, in order for the tabs 32, 22 to engage their respective engagement slots, 18, 28. Tabs 32, 22 also include an extended width I, FIG. 4, which inserts into the wide portion W of slots 18, 28.

Figure 6:
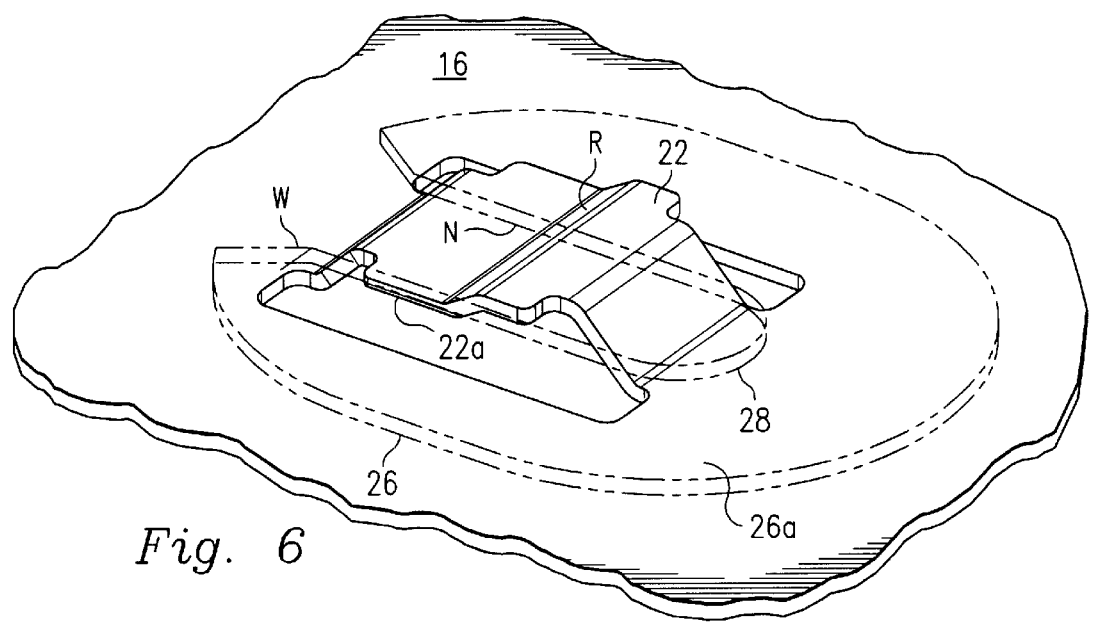
FIG. 6 is a perspective view illustrating an embodiment of a tab and slot engagement.

Engagement of an exemplary tab 22 with mating slot 28, FIG. 6, occurs by the raised portions H2, H1 of tab 22 first entering wide portion W of slot 28 and subsequently engaging narrow portion N of slot 28. A surface 22a of tab 22 engages a surface 26a adjacent slot 28 and opposite surface 26, see also FIGS. 3 and 4. A similar engagement occurs simultaneously between tab 32 and slot 18, not shown. The raised portion H2 and ramp R provide a lead-in for the raised portion H1.

Several advantages are realized by the embodiment disclosed herein. There is no need for additional hardware to be added to the bay and the component for the purpose of providing an alignment for proper plug connection. The slot and tab engagement provide precise alignment in a manner which minimizes plug misalignment and stress. Because the component is attached to one wall or surface of the bay, the permitted gap between the component and the other three walls or surfaces of the bay can be larger than otherwise acceptable without the concern of too much play between the component and the bay. Also, because the slots and tabs are provided in pairs at opposite ends of the bay and the component for simultaneous attachment, an enhanced retention apparatus is provided. Also, if preferred, a plurality of slots and tabs may be provided at each of the opposite ends of the bay and the component, respectively, however, at least one of each is required. In the case where a plurality of slots and tabs are used at each of the opposite ends of the bay and the component, some of the slots and tabs may be used for retention and the others may be used solely for alignment.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. Apparatus for securing a component in a computer system comprising:
    a housing having a component bay formed therein, the bay including a first and a second positioning device at opposite ends thereof; and
    a component removably mounted in the bay, the component including a first and a second positioning device at opposite ends thereof for engagement with the second and first positioning devices, respectively, of the bay, whereby, the second positioning device of the bay engages the first positioning device of the component and, simultaneously, the first positioning device of the bay engages the second positioning device of the component, wherein the first and second positioning devices of the bay are substantially the same as the first and second positioning devices of the component.

2. The apparatus as defined in claim 1 further comprising: a stop provided in the bay.

3. The apparatus as defined in claim 2 wherein the stop is adjacent the second positioning device of the bay.

4. A apparatus for securing a component in a computer system comprising:
    a housing having a component bay formed therein, the bay including a first and a second positioning device at opposite ends thereof; and
    a component removably mounted in the bay, the component including a first and a second positioning device at opposite ends thereof for engagement with the second and first positioning devices, respectively, at the bay, whereby, the second positioning device of the bay engages the first positioning device of the component and, simultaneously, the first positioning device of the bay engages the second positioning device of the component, wherein each of the first positioning devices is a slot and each of the second positioning devices is a tab.

5. The apparatus as defined in claim 4 wherein each tab has a first raised portion and a second raised portion.

6. The apparatus as defined in claim 5 wherein the first raised portion is of a first height and the second raised portion is of a second height greater than the first height.

7. The apparatus as defined in claim 5 wherein each raised portion includes an extended width.

8. The apparatus as defined in claim 6 wherein the first and second raised portions are interconnected by a ramp portion.

9. Apparatus for securing a component in a computer system comprising:
    a housing having a component bay formed therein, the bay including a first and a second positioning device spaced apart in a first sequence; and
    a component slidably engageable in the bay, the component including a first and a second positioning device spaced apart in a second sequence, which is inverse to the first sequence, whereby, the second positioning device of the bay engages the first positioning device of the component and, simultaneously, the first positioning device of the bay engages the second positioning device of the component, wherein each of the first positioning devices is a slot and each of the second positioning devices is a tab.

10. The apparatus as defined in claim 9 further comprising:
    a stop provided in the bay.

11. The apparatus as defined in claim 10 wherein the stop is adjacent the second positioning device of the bay.

12. The apparatus as defined in claim 10 wherein each tab has a first raised portion and a second raised portion.

13. The apparatus as defined in claim 12 wherein the first raised portion is of a first height and the second raised portion is of a second height greater than the first height.

14. The apparatus as defined in claim 12 wherein each raised portion includes an extended width.

15. The apparatus as defined in claim 13 wherein the first and second raised portions are interconnected by a ramp portion.

16. The apparatus as defined in claim 9 wherein the first and second positioning devices of the bay are substantially the same as the first and second positioning devices of the component.

17. A method of securing a component in a computer system comprising:
    providing a housing;
    providing a component bay in the housing;
    providing a first and a second positioning device spaced apart in a first sequence in the bay;
    providing a removable component for slidable engagement with the bay; and
    providing a first and a second positioning device spaced apart in a second sequence on the component, such that the second sequence is inverse to the first sequence, whereby, upon inserting the component in the bay, the second positioning device of the bay engages the first positioning device of the component and, simultaneously, the first positioning device of the bay engages the second positioning device of the component, wherein the first and second positioning devices of the bay are substantially the same as the first and second positioning devices of the component.

18. The method as defined in claim 17 further comprising:

providing a stop in the bay.

19. The method as defined in claim 18 further comprising:

providing the stop adjacent the second positioning device.

20. The method as defined in claim 17 further comprising:

extending the second device of the bay in a first direction and extending the second device of the component in a second direction, opposite the first direction.

21. A computer comprising:

a chassis;

a component bay in the chassis;

a first and a second positioning device spaced apart in a first sequence in the bay;

a removable component for slidable engagement with the bay; and a first and a second positioning device spaced apart in a second sequence on the component, such that the second sequence is inverse to the first sequence, whereby, upon inserting the component in the bay, the second positioning device of the bay engages the first positioning device of the component and, simultaneously, the first positioning device of the bay engages the second positioning device of the component, wherein the first and second positioning devices of the bay are substantially the same as the first and second positioning devices of the component.

22. The computer as defined in claim 21 further comprising:

a stop in the bay.

23. The computer as defined in claim 22 further comprising:

the stop being adjacent the second positioning device.

24. The computer as defined in claim 21 further comprising:

the first and second positioning devices of the bay being substantially the same as the first and second positioning devices of the component.

25. The computer as defined in claim 21 further comprising;

the second device of the bay extending in a first direction and the second device of the component extending in a second direction, opposite the first direction.

* * * * *

UNITED STATES PATENT AND TRADEMARK OFFICE
CERTIFICATE OF CORRECTION

PATENT NO.    : 6,667,887 B2
DATED         : December 23, 2003
INVENTOR(S)   : Vibora Sim et al.

It is certified that error appears in the above-identified patent and that said Letters Patent is hereby corrected as shown below:

<u>Column 3,</u>
Line 59, delete "A apparatus" and insert -- Apparatus --.

Signed and Sealed this

Thirtieth Day of March, 2004

JON W. DUDAS
*Acting Director of the United States Patent and Trademark Office*